United States Patent [19]

Carter

[11] Patent Number: 4,678,255

[45] Date of Patent: Jul. 7, 1987

[54] CHIP CONNECTOR

[75] Inventor: Clyde T. Carter, Shermans Dale, Pa.

[73] Assignee: Wells Electronics, Inc., South Bend, Ind.

[21] Appl. No.: 847,932

[22] Filed: Apr. 3, 1986

[51] Int. Cl.⁴ .............................................. H01R 13/62
[52] U.S. Cl. ...................................... 439/267; 439/71; 439/265
[58] Field of Search ............. 339/74 R, 75 M, 75 MP, 339/17 CF

[56] References Cited

U.S. PATENT DOCUMENTS 4,491,377  1/1985  Pfaff ................................... 339/74 R
4,498,047  2/1985  Hexamer et al. .............. 339/75 MP
4,533,192  8/1985  Kelley ............................. 339/17 CF
4,623,208  11/1986  Kerul et al. ..................... 339/17 CF Primary Examiner—John McQuade
Attorney, Agent, or Firm—Thomas J. Dodd

[57] ABSTRACT

A chip connector which includes conductive contacts which electrically contact the carrier. The contacts include an outwardly extending cantilevered projection to allow the contacts to be shifted outwardly on downward engaging movement of the connector top to allow insertion or removal of the chip. The connector base includes a wall positioning part which biases the contacts into a preloaded or clamped position.

4 Claims, 9 Drawing Figures

CHIP CONNECTOR

FIELD OF THE INVENTION

This invention relates to a connector and will have application to a chip connector for an intergrated circuit.

BACKGROUND OF THE INVENTION

Connectors or sockets for integrated circuits (IC) are designed to accommodate thermal expansion differential between the IC and the printed circuit board. Sockets are also utilized to test IC chips for burn-in and similar procedures. Such connectors or sockets often involve the use of spaced conductive contacts which hold the chip within the connector or socket. The contacts are spread apart by a spreader or top to allow insertion of the chip, then released to firmly hold the chip within the connector. Examples of such connectors are disclosed in U.S. Pat. Nos. 4,491,377; 3,763,462; and 4,332,431. Co-pending U.S. patent application, Ser. No. 719,718, now U.S. Pat. No. 4,623,208, discloses a socket which has a connector incorporating contacts with an integral cantilevered part. The contacts are spread apart by movement of the connector top into contact with the cantilevered part.

SUMMARY OF THE INVENTION

The connector of this invention includes a plurality of opposed cantilevered contacts positioned about the socket central opening. Each contact includes an outwardly protruding cantilevered part integral with the upstanding portion of the contact. As the cantilevered parts are depressed, the contacts are flexed outwardly to allow insertion of an IC chip. The connector includes a base which has integral upward walls about its central opening. The walls include integral positioning parts which locate the contact within the socket and serve to "preload" or bias the inward movement of each contact into its clamping position.

Accordingly, it is an object of this invention to provide an improved electrical connector for an IC which is of simple and reliable construction.

Another object of this invention is to provide an improved socket which is for an IC.

Another object of this invention is to provide for an IC socket which has an improved chip contacting member.

Another object of this invention is to provide for an IC connector which includes an improved base member for preloading each contact.

Still another object of this invention is to provide for an IC connector which precisely locates the chip within the device, and which assures adequate wiping of the contacts and the chip leads during operation.

Other objects of this invention will become apparent upon a reading of the following description.

BRIEF DESCRIPTION OF THE DRAWINGS

A preferred embodiment of the invention has been depicted for illustrative purposes wherein.

DESCRIPTION OF THE PREFERRED EMBODIMENT

The preferred embodiment herein described is not intended to be exhaustive or to limit the invention to the precise form disclosed. It is chosen and described to explain the principles of the invention and its application and practical use to enable others skilled in the art to utilize the inventions.

Figure 2:
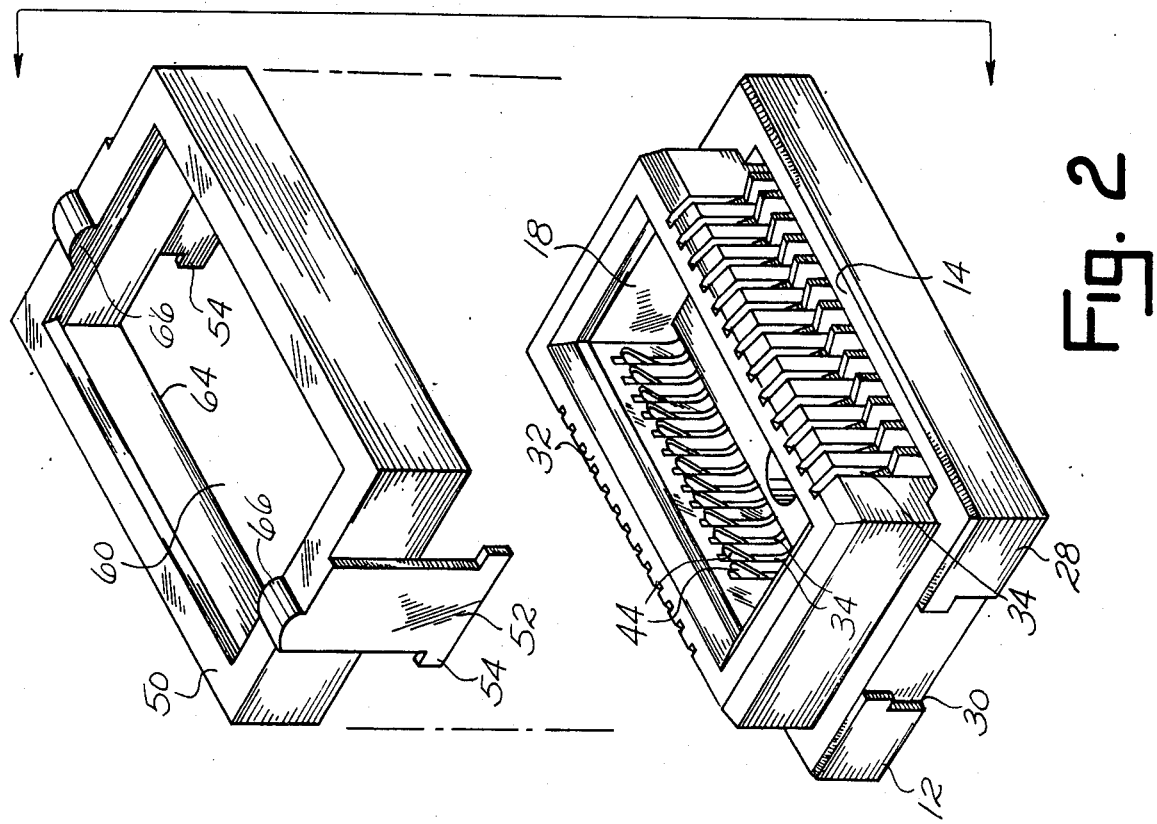
FIG. 2 is an exploded view of the connector.
Figure 1:
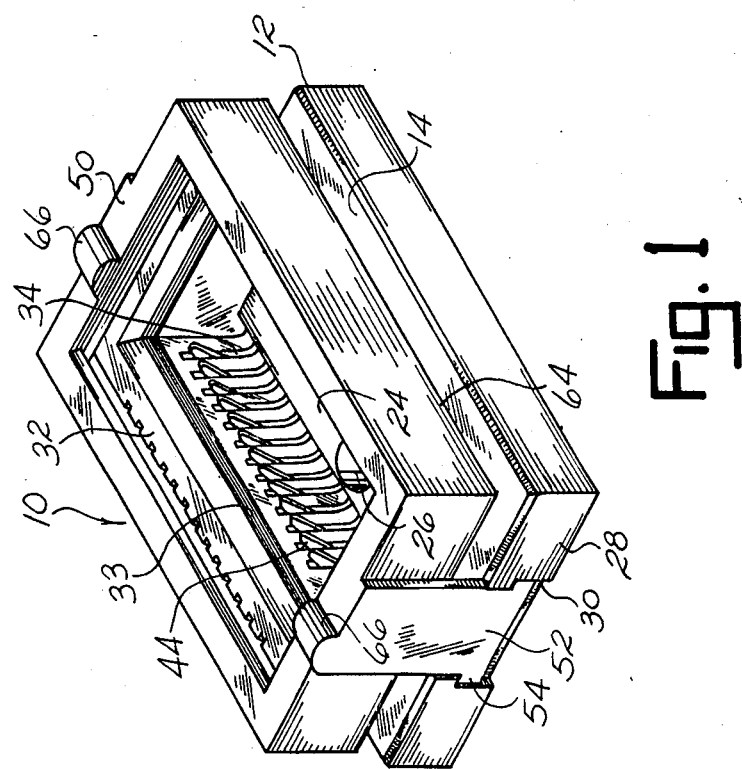
FIG. 1 is a perspective view of the connector shown in assembled form.
Figure 4:
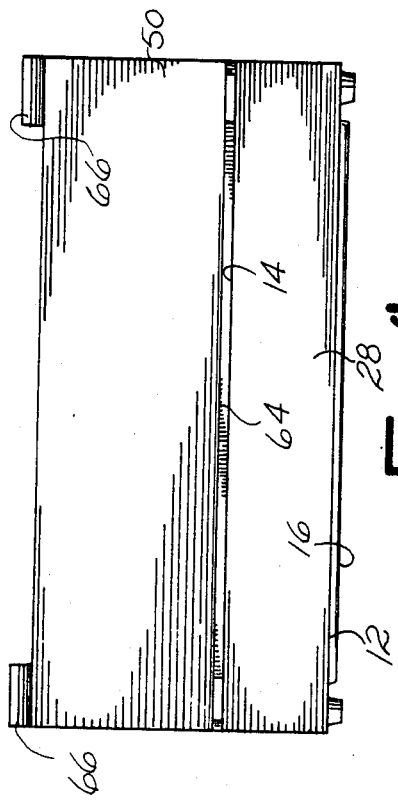
FIG. 4 is a side elevational view of the connector.
Figure 5:
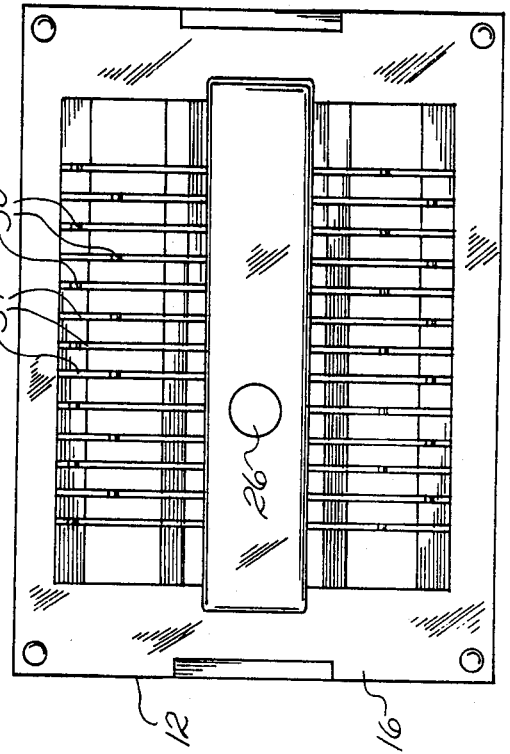
FIG. 5 is a bottom plan view of the connector.
Figure 3:
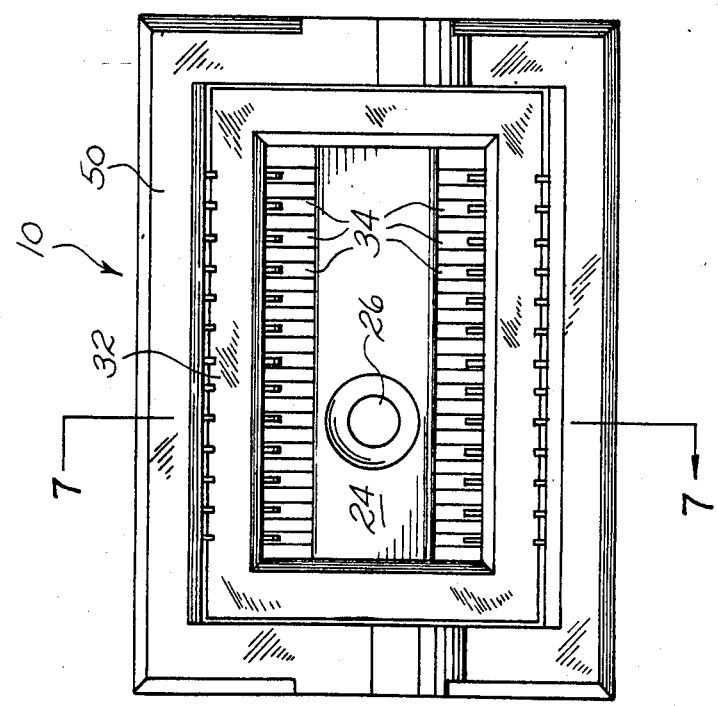
FIG. 3 is a top plan view of the connector.
Figure 7:
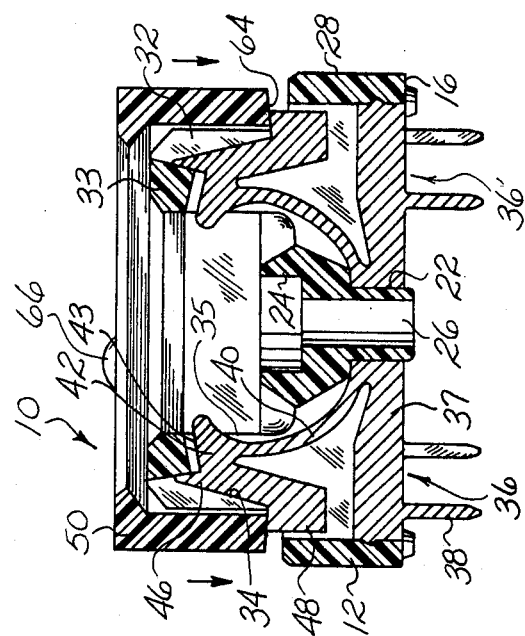
FIG. 7 is a sectional view of the connector taken along line 7—7 of FIG. 3, with the contacts in a clamped position.
Figure 6:
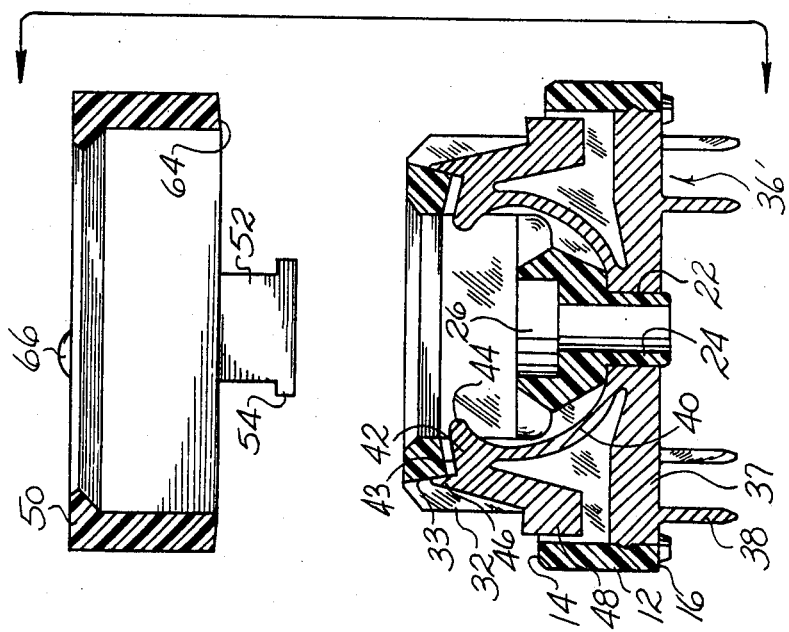
FIG. 6 is a sectional view of the connector with the top shown separated form the base member.

Referring to the drawings, numeral 10 refers to a connector or test socket for an integrated circuit chip 11. Connector 10 includes a base member 12 having a top face 14 and a bottom face 16. Base member 12 includes a central opening 18 which extends through faces 14 and 16. A plurality of grooves 22 are cut in base member face 14. A raised table section 24 extends into central opening 18 and includes a bore 26 which is adapted to house a mounting screw (not shown). Base member 12 also includes side faces 28, two of which include peripheral notches 30 as shown in FIG. 2. Base member 12 also includes continuous wall 32 which extends from top face 14 about central opening 18 as shown. Wall 32 includes an upper integral positioning part 33. A plurality of grooves 34 aligned with base grooves 22 are cut in opposed walls 32 as shown to form a locating cavity for chip 11.

Connector 10 also provides for a plurality of contacts 36. Each contact 36 is constructed of resilient electrically conductive material and is of the general cross-sectional configuration shown in FIGS. 7-8. Each contact 36 includes a foot part 37 which has a lower lead 38 which extends downwardly of base member 12. An integral curved neck 40 of each contact is fitted into aligned grooves 22 and 34. Each contact also includes an integral upper head 42 which terminates in an upper shelf 43 having chin part 44 offset from the contact neck 40 as seen in FIGS. 6–9. Head 42 includes an integral projection 46 which extends upwardly from shelf 43 as shown in FIGS. 6–9, and a downwardly and outwardly extending platform portion 48. Connector 10 also includes an actuator or top 50 having the general configuration shown in FIG. 2, and includes oppositely positioned latches 52. Each latch 52 includes a tab 54 and is of the substantially T-shaped configuration shown to allow an interlocking arrangement with base notches 30. Top 50 includes a central opening 60 to allow for the insertion of chip 11 into connector 10 and an abutment part 64 at each of its sides. Top 50 also includes integral projection parts 66 which are located at opposite ends of the top at a position slightly spaced from the center of the top edge.

With contacts 36 positioned in grooves 22,34 of base member 12 and with leads 38 extending through base member bores 20, top 50 is placed over and pushed downwardly upon the base members until latch tabs 54 engage in base notches 30 to secure the top to the base member. Each abutment part 64 of top 50 bears on contact platform 48, and each wall positioning part 33 bears against contact shelf projection 46 to preload the contact into the clamped position of FIG. 7.

Figure 9:
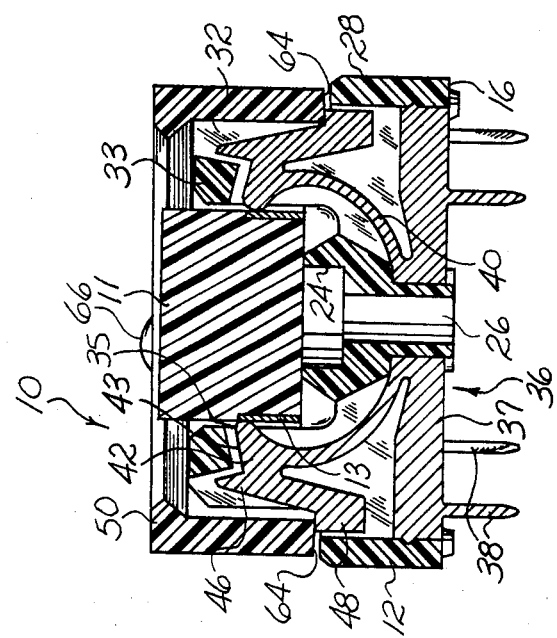
FIG. 9 is a sectional view similar to FIG. 7 but showing the chip inserted and the contacts in a clamped position.
Figure 8:
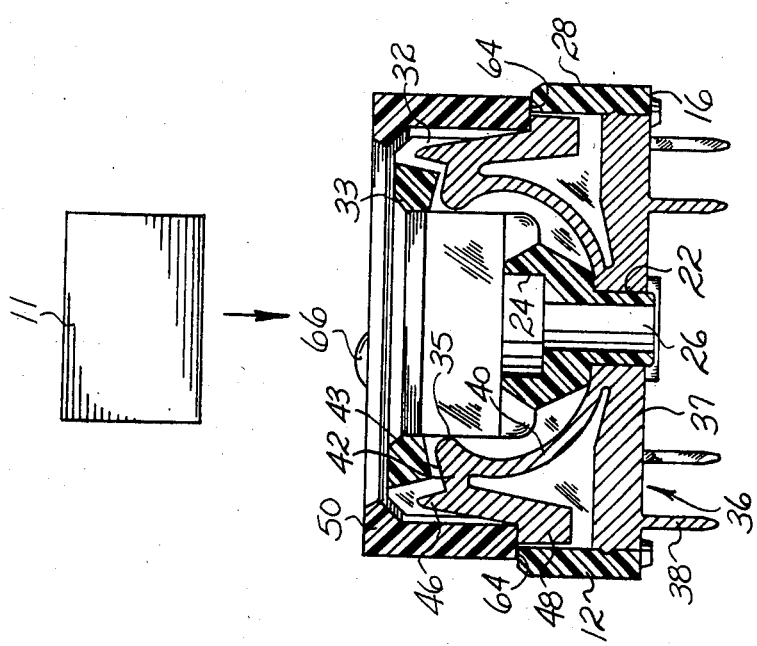
FIG. 8 is a sectional view similar to FIG. 7 but showing the contacts in a retracted position just prior to chip insertion.

To operate connector 10, top 50 is pushed downwardly towards base member 12 into its lower position as seen in FIG. 8. Abutment parts 64 urge contact platforms 48 downwardly to create a moment about contact necks 40. This causes contact heads 42 to shift outwardly so as to allow chip 11 when inserted into top opening 60 to be supported atop base member table section 24 between walls 32. Top 50 is then released. Projection parts 66 may be positioned closer to one side edge of actuator 50 as shown in the drawings. Tension from contact platforms 48 under the influence of contact necks 40 urges top 50 upwardly away from base member 12 to allow contact chin parts 44 to compressively contact the integral leads 13 of chip 11 as seen in FIG. 9. Although a leadless chip 11 is shown, other chips having J-leads or similar lead configurations may be used. Chip 11 may be released by pushing top 50 into its lowered position to spread contact leads 36,36' away from the chip.

It is understood that the invention is not limited to the above-given details,, but may be modified within the scope of the appended claims.

I claim:

1. A connector for a chip carrier, said connector including a base member having a central opeing therein, a plurality of conductive contacts for engaging said carrier, each contact anchored in said base member and including an upwardly extending part, said contacts positioned on at least one side edge of said base member opening and constituting clamp means for engaging said carrier within said, connector, the improvement wherein each contact includes an upward projection extending from its upwardly extending part, and a cantilevered part projecting outwardly from the upwardly extending part outwardly of said base member opening, said base member including integral positioning means contacting each contact upward projection for biasing said contacts in a clamping position within said base member opening, and a movable top overlying said base member, said top including an abutment means in contact with each said contact cantilevered part for moving and flexing said contacts into an unclamped position outwardly of said base member opening upon movement of the top in a substantially straight line downward direction.

2. The connector of claim 1 wherein said top includes latch parts extending towards said base member, each latch part including a tab, said base member including notches for accepting said tabs to secure said top to the base member.

3. The connector of claim 1 wherein each contact includes a foot part anchored in said base member, an integral lead extending downwardly from said foot part, said contact upwardly extending part including an integral neck extending upwardly from said foot part, and a head integrally formed atop said neck having inner and outer edges, said, inner edge terminating in an inwardly extending chin part, said cantilevered part being a platform projecting downwardly and outwardly from said head outer edge.

4. The connector of claim 1 wherein said base member positioning means includes a continuous upstanding wall about said base member central opening, said top including aligned projection parts at opposite ends of the top with said projection parts being positioned nearer to one side edge of the top then to an opposite side edge of the top.

* * * * *